US006960807B2

(12) United States Patent
Pendharkar

(10) Patent No.: US 6,960,807 B2
(45) Date of Patent: Nov. 1, 2005

(54) DRAIN EXTEND MOS TRANSISTOR WITH IMPROVED BREAKDOWN ROBUSTNESS

(75) Inventor: Sameer P. Pendharkar, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 44 days.

(21) Appl. No.: 10/721,567

(22) Filed: Nov. 25, 2003

(65) Prior Publication Data
US 2005/0110081 A1 May 26, 2005

(51) Int. Cl.[7] .................. H01L 29/76; H01L 29/94; H01L 31/062; H01L 31/113; H01L 31/119
(52) U.S. Cl. .................. 257/336; 257/335; 257/344; 257/349; 257/408; 257/500; 257/501; 257/506; 257/E29.256; 257/E29.266
(58) Field of Search ................ 257/349, 506, 257/E29.256, E29.266, 335, 344, 408, 500, 257/336, 501

(56) References Cited

U.S. PATENT DOCUMENTS

| 5,294,824 | A  | * | 3/1994  | Okada .................. 257/409 |
| 5,777,371 | A  | * | 7/1998  | Kawaguchi et al. ....... 257/409 |
| 6,071,768 | A  | * | 6/2000  | Duvvury et al. .......... 438/234 |
| 6,365,940 | B1 | * | 4/2002  | Duvvury et al. .......... 257/356 |
| 6,521,962 | B2 | * | 2/2003  | Evans .................. 257/409 |
| 6,639,277 | B2 | * | 10/2003 | Rumennik et al. ......... 257/342 |
| 6,897,525 | B1 | * | 5/2005  | Kikuchi et al. .......... 257/343 |
| 2002/0125530 | A1 | * | 9/2002 | Imam et al. ............. 257/343 |
| 2002/0135019 | A1 | * | 9/2002 | Noda .................... 257/367 |
| 2002/0137292 | A1 | * | 9/2002 | Hossain et al. .......... 438/289 |
| 2003/0038307 | A1 | * | 2/2003 | Watanabe et al. ......... 257/257 |
| 2004/0051125 | A1 | * | 3/2004 | Kikuchi et al. .......... 257/288 |
| 2004/0079975 | A1 | * | 4/2004 | Pendharkar ............. 257/288 |
| 2005/0064670 | A1 | * | 3/2005 | Pan et al. .............. 438/305 |

OTHER PUBLICATIONS

Aur and Chatterjee, "Robustness of LDD nMOS Transistors Subjected to Measurement of Drain Breakdown Voltage", *Extended Abstracts of the 22nd Conference on Solid State Devices and Materials*, Paper C-6-8 (1990), pp. 319-322.

* cited by examiner

*Primary Examiner*—Michael Trinh
*Assistant Examiner*—Ida M. Soward
(74) *Attorney, Agent, or Firm*—Peter K. McLarty; W. James Brady, III; Frederick J. Telecky, Jr.

(57) ABSTRACT

A drain-extended metal-oxide-semiconductor transistor (40) with improved robustness in breakdown characteristics is disclosed. Field oxide isolation structures (29c) are disposed between the source region (30) and drain contact regions (32a, 32b, 32c) to break the channel region of the transistor into parallel sections. The gate electrode (35) extends over the multiple channel regions, and the underlying well (26) and thus the drift region (DFT) of the transistor extends along the full channel width. Channel stop doped regions (33) underlie the field oxide isolation structures (29c), and provide conductive paths for carriers during breakdown. Parasitic bipolar conduction, and damage due to that conduction, is therefore avoided.

17 Claims, 5 Drawing Sheets

DRAIN EXTEND MOS TRANSISTOR WITH IMPROVED BREAKDOWN ROBUSTNESS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of semiconductor integrated circuits, and is more specifically directed to the construction of transistors in such circuits.

A continuing trend in the field of electronic devices and systems is the integration of system functions into fewer integrated circuits. Larger-scale integration provides improved device and system performance, because of such factors as the excellent matching among transistors within the same integrated circuit, the very short conduction path lengths among functions on the same integrated circuit, and the elimination of interface circuitry that is necessary for communication of signals between separate integrated circuits. These benefits are attained along with the significantly lower manufacturing cost with these fewer integrated circuits in the system. Ultimately, the goal continues to be the so-called "system on a chip", in which all electronic functions of the end system are implemented within a single integrated circuit.

However, the integration of many system functions into fewer integrated circuits is difficult for certain types of electronic systems, especially those that must interface with relatively high voltages, such as communications systems. For example, modems (modulator/demodulators) must be compatible with relatively high voltages that are required by, or may be present on, telephone or cable lines. Wireless telephone handsets also require the generation of signals at relatively high output voltages, consistent with strong output signal power levels for good communications. Conversely, modern high-performance logic and memory circuits operate at decreasing power supply voltages, permitting high density integration of today's complex functionality by way of extremely small transistors, which have structures that cannot tolerate high voltages. For example, modern high-performance metal-oxide-semiconductor (MOS) transistors have extremely thin gate oxide layers, and also extremely shallow junctions, both of which can be easily damaged by overvoltage. These colliding trends cause a tradeoff between high-voltage robustness, on one hand, and device density and performance, on the other hand.

One transistor type that has been developed in recent years to address the problem of high voltages applied to small-geometry transistors is the drain-extended MOS ("DEMOS") transistor. An example of a conventional drain-extended MOS transistor is shown in FIGS. 1a and 1b, and will now be described.

The transistor of FIGS. 1a and 1b is an n-channel DEMOS device, formed at a surface of lightly-doped substrate 2. This exemplary structure, as typical in the art for integrated circuits constructed according to complementary MOS (CMOS) technology, is formed according to a conventional twin-well process, in which p-type well region 4 and n-type well region 6 are formed at the surface of substrate 2. Both in the illustrated location and elsewhere in the integrated circuit, wells 4, 6, serve as the body region for n-channel MOS and p-channel MOS transistors, respectively, and as such are typically relatively lightly doped. Field oxide structures 9a, 9b are formed, by local oxidation of silicon (LOCOS) or by deposition and etching, at those locations of the surface of wells 4, 6 that are to isolate conductive regions from one another. The conductive regions of the surface of wells 4, 6 that are isolated by field oxide structures 9a, 9b are typically referred to as "moat" regions, and serve as the active regions (source, drain, and channel) of MOS devices, as known in the art. In this conventional example, doped regions 13 are disposed beneath field oxide structures 9, and are formed by the well-known "channel stop" ion implant to enhance the isolation provided by field oxide regions 9. Channel stop doped region 13p is a p-type region underlying field oxide structure 9a in p-well 4, and is more heavily doped than is p-well 4 to provide a higher p-type surface concentration in the isolation region underlying field oxide structure 9a; similarly, channel stop doped region 13n is a more heavily doped n-type region underlying field oxide structure 9b in n-well 6, to provide a higher n-type surface concentration in the isolation region underlying field oxide structure 9b.

The active portions of this conventional DEMOS device are formed by self-aligned ion implantation at the surface of wells 4, 6. In this example, gate electrode 15 is a patterned layer of polysilicon, metal, silicide-clad polysilicon, or another known conductive material suitable for use as a transistor gate, and is disposed over gate oxide layer 11. Sidewall insulating filaments may be disposed along the edges of gate electrode 15, as used in the formation of graded junctions in the well-known manner. Source region 10 is a heavily-doped n-type region that is formed by ion implantation in a self-aligned manner relative to gate electrode 15 and field oxide structure 9a at the surface of p-well 4. Drain region 12 is a heavily doped n-type region formed by ion implantation into the surface of n-well 6, self-aligned relative to field oxide structure 9b, preferably using the same implant or implants as used to form source region 10. Similarly, backgate contact region 8 is a heavily-doped p-type region formed at a selected location of well 8, by way of ion implantation into a selected location of the surface of p-well 4, self-aligned relative to field oxide structure 9a.

Overlying insulator layer 7 is disposed over all of the underlying structures, including gate electrode 15; field oxide structures 9; and source, drain, and backgate contact regions 10, 12, 8 respectively. Contact openings C are etched through insulator layer 7 at selected locations, and metal is then sputter deposited or evaporated overall, and etched in the conventional manner to form conductors BG, S, and D as shown in FIG. 1a.

As mentioned above, the conventional transistor of FIGS. 1a and 1b is a drain-extended device. This drain extension is implemented by field oxide structure 9b that is disposed between drain region 12 and source region 10, on the drain end of the channel, and onto which gate electrode 15 overlaps. As shown in FIG. 1a, n-well 6 extends beyond field oxide structure 9b and has an edge underlying gate electrode 15. When transistor is turned on by the application of a positive voltage to gate electrode 15, electrons conduct from source region 10 toward the higher voltage at drain region 12 along the channel formed under gate oxide 11 by the voltage on gate electrode 15. Upon reaching n-well 6, the inversion channel is no longer present, but the electrons continue to drift toward drain region 12. As such, the portion of n-well 6 between drain region 12 and the channel region formed in p-well 4 is referred to as the "drift region" of the DEMOS device, and is shown in FIG. 1a as drift region DFT.

As known in the art, drain-extended MOS devices such as that shown in FIGS. 1a and 1b are capable of tolerating the application of higher drain-to-source voltages than are "regular" MOS devices that have similar geometries, gate oxide thicknesses, junction depths, but that are not drain-extended. This higher voltage can be tolerated because of the presence of drift region DFT, as shown in FIG. 1a, which effectively moves highly-doped drain region 12 from the body region of the device formed by p-well 4 in this example. Rather, the metallurgical drain-to-body junction of this DEMOS device is at the junction between p-well 4 and n-well 6, both of which are relatively lightly doped. The reverse breakdown voltage of the devices is thus much higher than for a conventional device in which the metallurgical junction would be between drain region 12 and p-well 4. In addition, the drain-side edge of gate electrode 15 is moved away from the conduction channel, protecting this edge and the underlying gate oxide 11 from the high electric fields that may be present at high drain voltages. In addition, as shown in FIG. 1b, the channel width of the conventional DEMOS device is quite large, even relative to the relatively long channel length between the source and the drift region, permitting this device to conduct a relatively large current when on.

Because of these effects, conventional DEMOS devices such as the n-channel transistor illustrated in FIGS. 1a and 1b have become popular in mixed-signal (i.e., analog and digital) integrated circuits, particularly those in which the digital transistors are required to have maximum performance but in which some transistors may be required to tolerate or source high voltages. An example of the application of a DEMOS transistor such as that shown in FIGS. 1a and 1b is for driving the gate of an output driver transistor, particularly where the gate voltage of the output device is to be driven to a voltage higher than its drain, such that the output voltage swing of the integrated circuit can be fully rail-to-rail.

It has been observed, however, that many conventional DEMOS devices are vulnerable to irreversible damage once they have enter a reverse breakdown condition. FIG. 2 qualitatively illustrates the current-voltage breakdown characteristics of a typical DEMOS device, constructed according to the conventional arrangement such as shown in FIGS. 1a and 1b. These characteristics are based on actual measurements of a conventional DEMOS n-channel device, with its gate and source at ground, and its drain voltage swept to positive levels relative to the gate and source. In this "off" condition for an enhancement mode DEMOS device, significant source-drain conduction does not begin until reverse breakdown.

Sweep $SW_1$ illustrates a measured current-voltage characteristic for a first sweep of drain voltage relative to gate and source. By way of reference, the "knee" voltage at which significant source-drain current begins in sweep $SW_1$ is at a drain voltage of about 50 volts, which is the reverse breakdown voltage observe for this sweep. Even with the source-drain current limited to about 1 $\mu A$, the next breakdown voltage sweep resulted in a characteristic as shown by sweep $SW_2$, in which breakdown conduction begins virtually with any positive drain voltage, at relatively high current levels. The obvious conclusion from these two sweeps $SW_1$ and $SW_2$ is that the DEMOS device was damaged when entering reverse breakdown even a single time.

This breakdown damage has been observed by others in the art. Aur and Chatterjee, "Robustness of LDD nMOS Transistors Subjected to Measurement of Drain Breakdown Voltage", *Extended Abstracts of the 22$^{nd}$ Conference on Solid State Devices and Materials,* Paper C-6-8 (1990), pp. 319–22, describes this phenomenon. While the cause of this breakdown damage is not exactly known, it is believed that this breakdown damage is due to the breakdown occurring in a highly localized manner within the device. Such a highly localized breakdown can trigger the conduction of the parasitic n-p-n bipolar transistor formed by drain 12 and n-well 6 as the collector, p-well 4 as the base, and source region 10 as the emitter. Conduction of this parasitic n-p-n transistor can cause further current crowding, which eventually leads to filamentation, and increase in current flow between drain and source. This theory remains consistent with current observations.

Various techniques for reducing the vulnerability of DEMOS devices to this breakdown damage by reducing the ability of the parasitic bipolar device to conduct, are known in the art. One such approach is to increase the doping concentration of the body region of the DEMOS device, thus increasing the doping concentration of the base of the parasitic bipolar device and inhibiting its conduction. However, the doping concentration of the wells in regular (i.e., non-drain-extended) MOS devices cannot be increased without adversely affecting the performance of those devices; accordingly, the formation of different well regions for the DEMOS and normal MOS devices requires additional mask and implant steps, and is thus quite costly. Another known approach is to apply a negative voltage bias to the body region of the DEMOS device, ensuring that the base-emitter junction of the parasitic bipolar device does not forward bias and thus preventing parasitic bipolar conduction. However, this negative backgate bias prevents the sharing of the well of the DEMOS device with normal MOS devices, and also will change the threshold voltage of the transistors which may, in turn, require adjustment of the gate oxide thickness. Another known approach is to increase the channel length of the DEMOS device, specifically by increasing the overlap region between the gate electrode and the active channel region to further inhibit bipolar conduction; however, this approach obviously increases the on-resistance of the DEMOS devices.

Another known technique for limiting breakdown damage in conventional DEMOS devices is to integrate the backgate contact region with the source region of the device, by alternating n+ and p+ regions adjacent to one another at the location of source region 10 in FIGS. 1a and 1b. The same overlying metal conductor contacts these alternating regions, thus making contact to the p+ region in the p-well to establish the backgate bias and to the n+ source region within the p-well. This arrangement ensures that the applied backgate bias relative to the source is exactly zero volts, which inhibits the parasitic bipolar conduction by preventing the base-emitter junction from becoming forward biased. However, this integrated source construction of course constrains the DEMOS devices to have a zero volt backgate bias, and prevents the fabrication of symmetric p-channel and n-channel DEMOS transistors in the same integrated circuit.

BRIEF SUMMARY OF THE INVENTION

It is therefore an object of this invention to provide a drain-extended metal-oxide-semiconductor transistor structure that can tolerate reverse breakdown events without being damaged.

It is a further object of this invention to provide such a transistor structure that does not constrain the fabrication of non-drain-extended devices in the same integrated circuit.

It is a further object of this invention to provide such a transistor structure that does not require additional photolithography operations and does not require additional ion implantation processes.

It is a further object of this invention to provide such a transistor structure having this improved robustness yet still retain a high reverse breakdown voltage.

It is a further object of this invention to provide such a transistor structure that not only tolerates breakdown events, but also tolerates relatively high breakdown currents without damage.

Other objects and advantages of this invention will be apparent to those of ordinary skill in the art having reference to the following specification together with its drawings.

The present invention may be implemented into a drain-extended metal-oxide-semiconductor (MOS) transistor, of either n-channel type or p-channel type, or both. The channel region of the transistor is broken up into sections beneath the gate electrode, with the regions between channel region sections having been implanted with relatively heavy concentrations of the same dopant type as the channel region, preferably with the "channel-stop" implant. The gate electrode and the drift region of the transistor are not broken up in this manner, but extend along the full width of the device. As a result of this construction, carrier conduction from drain-to-source in the reverse breakdown situation occurs in the regions between the channel region sections, along the higher doping concentration channel stop regions. This conduction prevents the parasitic bipolar device from turning on, and thus prevents the localized damage to the structure from such breakdown. The additional "on" resistance due to the narrowing of the channel region is insignificant because this resistance is dominated by the resistivity of the drift region of the device, which is uniform and not broken.

DETAILED DESCRIPTION OF THE INVENTION

The present invention will be described in connection with its preferred embodiment, namely as implemented into an n-channel drain-extended metal-oxide-semiconductor (DEMOS, or drain-extended MOS) transistor formed into a bulk silicon substrate. This exemplary embodiment is believed to especially benefit from this invention, as will its complementary p-channel DEMOS devices. However, it is also contemplated that this invention will have benefit in other implementations, including transistors formed into other substrate arrangements such as silicon-on-insulator, depletion mode field-effect transistors (FETs), junction FETs, and the like. Accordingly, it is to be understood that the following description is provided by way of example only, and is not intended to limit the true scope of this invention as claimed.

Figure 3A:
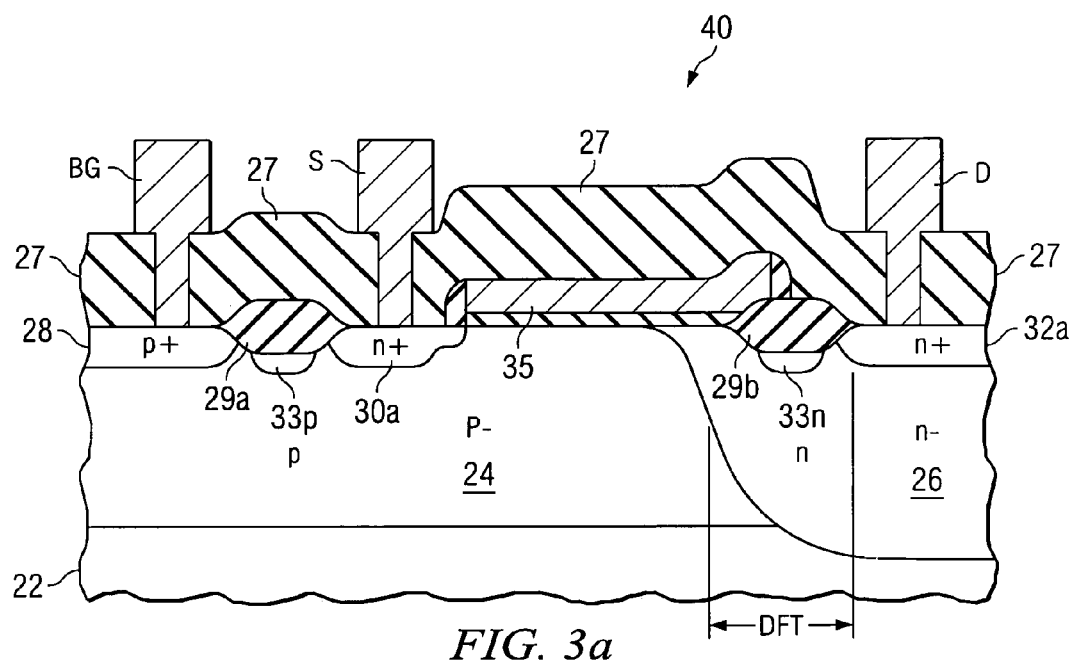
FIGS. 3a and 3c are cross-sectional views of a drain-extended MOS transistor according to the preferred embodiment of the invention.
Figure 3B:
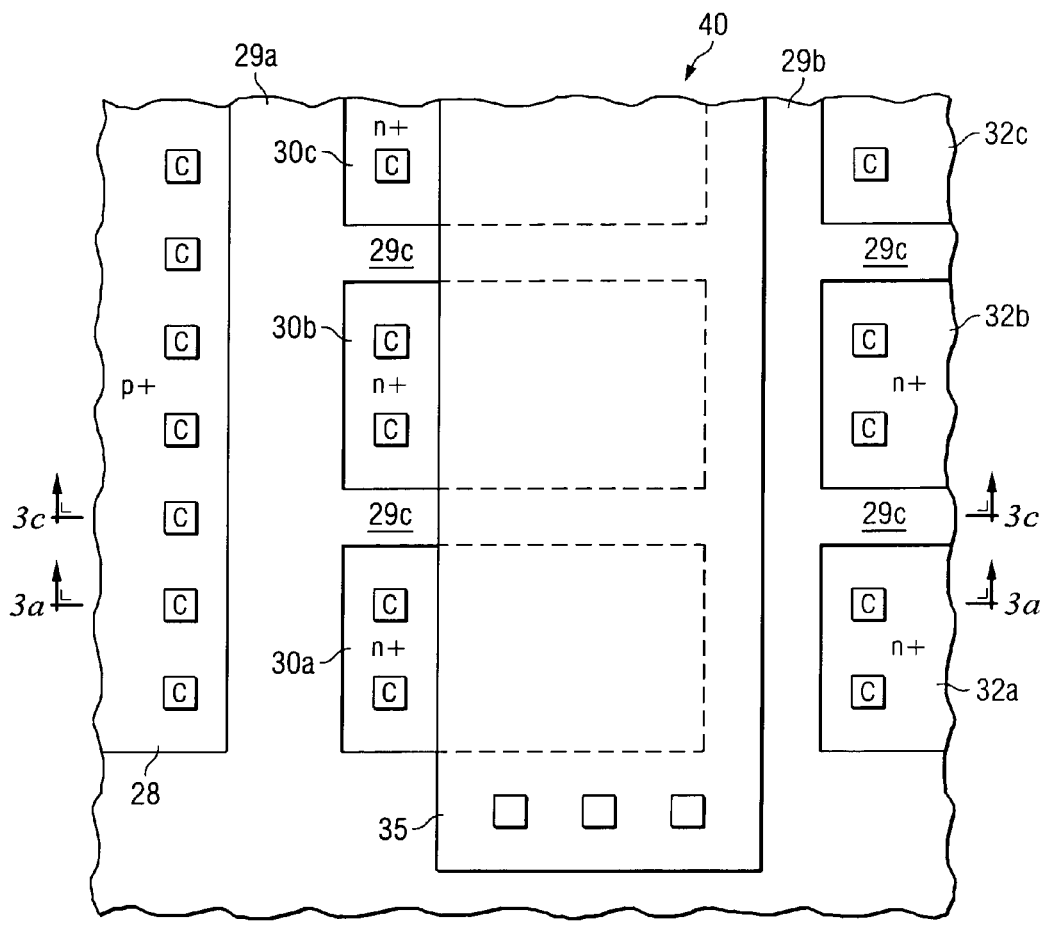
FIG. 3b is a plan view of the drain-extended MOS transistor shown in the cross-sectional views of FIGS. 3a and 3c, and constructed according to the preferred embodiment of the invention.
Figure 3C:
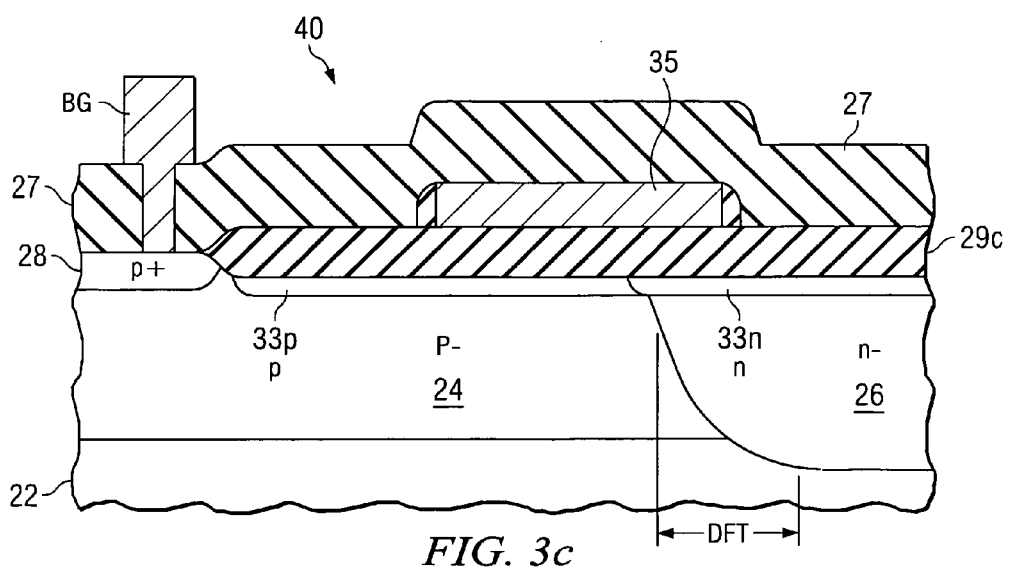

Referring now to FIGS. 3a through 3c, n-channel drain-extended MOS transistor 40 constructed according to the preferred embodiment of the invention will now be described in detail. As mentioned above, a p-channel DEMOS transistor may be similarly constructed; indeed, it is contemplated that both n-channel and p-channel devices constructed according to this preferred embodiment of the invention will be implemented within the same integrated circuit, particularly when the integrated circuit is constructed according to conventional complementary metal-oxide-semiconductor (CMOS) technology. It is contemplated, however, that this invention is particularly beneficial in the n-channel context, because of the higher gain and conduction of n-p-n bipolar transistors, such as the parasitic bipolar transistor present in the n-channel DEMOS device shown in FIGS. 3a through 3c, relative to the gain and conduction of the complementary parasitic p-n-p bipolar transistor present in the p-channel DEMOS case.

Similarly as the conventional transistor described above, transistor 40 is formed at a surface of lightly-doped substrate 22. In the alternative to this bulk silicon construction, transistor 40 may instead be formed in a silicon-on-insulator layer, in which case the active regions of the device will be doped regions within a layer of epitaxial silicon. As shown in FIG. 3a, p-well 24 is a relatively lightly doped region formed by way of a masked ion implantation into selected regions of the surface of substrate 22; similarly, in this twin-well construction, n-well 26 is a relatively lightly-doped region of substrate 22, also formed by masked ion implantation. In this example, n-well 26 is formed after the formation of p-well 24, although of course this order may be reversed. Both well implants are followed by a high-temperature anneal to diffuse the implanted dopant in the conventional manner. In the conventional manner, drain-extended MOS transistor 40 shown in FIG. 3a is merely one device within an integrated circuit having regular MOS transistors (i.e., without drain extensions) formed elsewhere. For ease of manufacture and for low cost, other instances of p-well 24 are preferably formed elsewhere in the integrated circuit, within which regular n-channel MOS transistors are formed; similarly, other instances of n-well 26 are preferably formed elsewhere in the integrated circuit, within which regular p-channel MOS transistors are formed.

Alternatively, transistor 40 may be formed by way of a single well process, rather than as twin wells as shown in FIG. 3a. In one example of such an alternative embodiment, n-well 26 may be a conventional well formed by ion implantation and anneal into a p-type epitaxial layer. In this case, region 24 of the structure in FIGS. 3a and 3c would refer to a portion of the p-type epitaxial layer that is protected from the n-well implant. Conversely, p-well 24 may be a single p-type well formed into an n-type epitaxial layer, in which case region 26 in FIGS. 3a and 3c would refer to an unimplanted portion of this n-type epitaxial layer. It is contemplated that those skilled in the art having reference to this specification can implement this invention in such single-well and other alternative process flows.

Referring to FIG. 3a, field oxide isolation structures 29a, 29b are also disposed within p-well 24 and n-well 26, respectively, at the surface of substrate 22. Field oxide structures 29a, 29b are preferably formed by way of local oxidation of silicon (LOCOS), which is a conventional isolation technique known in the art. Channel stop regions 33p, 33n are disposed under field oxide structures 29a, 29b, in this embodiment of the invention. As also known in the art, channel stop regions 33 correspond to implanted regions that underlie field oxide structures 29, or other isolation structures as used in the integrated circuit, and which have a somewhat higher dopant concentration, of the same conductivity type, than the underlying well 24, 26. In this example, channel stop region 33p is a p-type region formed within p-well 24 under field oxide structure 29a, and has a dopant concentration selected to provide the desired threshold voltage for the field transistor formed by the corresponding field oxide structure 29a, so that this device remains off. Similarly, channel stop region 33n is an n-type region formed within n-well 26 under field oxide structure 29b to a dopant concentration that provides the desired threshold voltage for the field transistor formed by the corresponding field oxide structure 29c. In one example, it is contemplated that channel stop regions 33p, 33n will have a surface dopant concentration that is about two orders of magnitude higher than that of p-well 24 and n-well 26, respectively, as such a dopant concentration was found to provide the desired isolation threshold voltage.

Channel stop regions 33p, 33n may be formed in the conventional manner, as part of the formation of field oxide structures 29. For example, after the implant (and perhaps anneal or diffusion) of p-well 24 and n-well 26, a patterned layer of silicon nitride may be formed over the surface of silicon substrate 22 to define the locations at which field oxide structures 29 are not to be formed; this patterned layer of silicon nitride also serves to block the channel stop implant. A mask layer can then patterned to protect the surface of n-well 26 (along with the patterned nitride layer), so that only those surface locations of p-well 24 at which field oxide structures 29 are to be formed are exposed; the p-type channel stop implant is then performed. Another mask layer can then be patterned so that it and the patterned nitride layer protect the surface of p-well 24 at locations other than those at which field oxide structures will be formed, permitting the n-type channel stop implant to impact the remaining exposed locations. The mask layer is then removed, leaving the patterned nitride layer, and the structure is oxidized to form field oxide structures 29 in the conventional manner. Because the patterned nitride layer exposes those locations that both receive the channel stop implant and are also oxidized, each resulting field oxide structure 29 is formed over a channel stop region 33 of the appropriate conductivity type for its corresponding well 24, 26. As shown in FIG. 3a, p-type channel stop region 33p is located under field oxide structure 29a at p-well 24. Also in this example, n-type channel stop region 33n is located under field oxide structure 29b at n-well 26. However, this n-type channel stop region 33n need not be present within the drift region of transistor 40, and therefore the n-type channel stop implant need not be performed (if not needed elsewhere in the integrated circuit) or may be masked within transistor 40 if convenient.

Of course, other isolation structure types may alternatively be used in connection with this invention. For example, rather than a thermally grown field oxide, a shallow trench may be etched into the surface of wells 24, 26 at the isolation locations, for example using a patterned nitride layer to define the trench locations, followed by the appropriate channel stop implants into p-well 24 and n-well 26. The implanted trenches can then be filled with a deposited film of silicon dioxide or another appropriate insulator. Further in the alternative, channel stop regions 33 may be formed after the formation of the corresponding field oxide or shallow trench isolation oxide structures by way of a high energy ion implant, to provide the desired channel stop dose at the desired depth beneath the isolation oxide structures. The particular manner in which channel stop regions 33 are formed is not critical in the realization of the preferred embodiment of the invention.

The active portions of DEMOS transistor 40 are constructed in the conventional manner. The "moat" regions at the surface of wells 24, 26, which were protected by the patterned nitride layer as described above, serve as the source, drain, and channel regions of transistor 40. Gate electrode 35 is formed by deposition of polysilicon, metal, or another known conductive gate material over gate oxide 33, followed by a patterned etch to define the gate and channel region of DEMOS transistor 40. In this example, as shown in FIGS. 3a and 3c, gate electrode 35 overlaps n-well 26 and field oxide structure 29b (and also field oxide structures 29c, described below), defining both the channel region and the drift region of transistor 40. N+ source region 30a in transistor 40 is formed by ion implantation in a self-aligned manner relative to gate electrode 35 and field oxide structure 29a; n+ drain region 32a is formed by the same implant as that of source region 30a, but is self-aligned relative to field oxide structure 29b (and not gate electrode 35) due to the drain-extended nature of transistor 40. Preferably, the same n-type implant used to form source region 30a and drain region 32a also implants the source/drain regions for regular n-channel MOS transistors in the integrated circuit. P+ backgate contact region 28 is formed by an ion implant, preferably the same implant as used to form p-type source/drain regions in regular p-channel MOS transistors in the integrated circuit, and is also self-aligned relative to field oxide structure 29a. Sidewall filaments may be formed along the sidewalls of gate electrode 35, if the source/drain regions of MOS transistors in the integrated circuit are to have lightly-doped-drain extensions, as well-known in the art. Doped regions 28, 30a, 32a, and gate electrode 35, may be silicide-clad after formation, for example by the well-known self-aligned silicidation method, if desired.

Overlying insulator layer 27 is disposed over doped regions 28, 30a, 32a, and gate electrode 35. Insulator layer 27 may be formed of deposited silicon dioxide, another deposited inorganic insulator, or a spin-on type organic or inorganic layer, depending upon the particular manufacturing processes used. Contact openings C are etched through insulator layer 27 in the conventional manner, followed by the deposition and patterned etching of a metal conductor layer, to form metal conductors BG, S, and D which make contact to doped regions 28, 30a, 32a of transistor 40 as shown. As shown in FIG. 3c, contact openings C are also etched through insulator layer 27, so that contact can be made to gate electrode 35 by a metal conductor (metal not being shown in FIG. 3c). As known in the art, additional levels of metal conductors may be formed, and indeed various ones of the conductors making contact to the elements of transistor 40 may be formed in different metal layers, depending upon the layout of the integrated circuit.

Figure 1A:
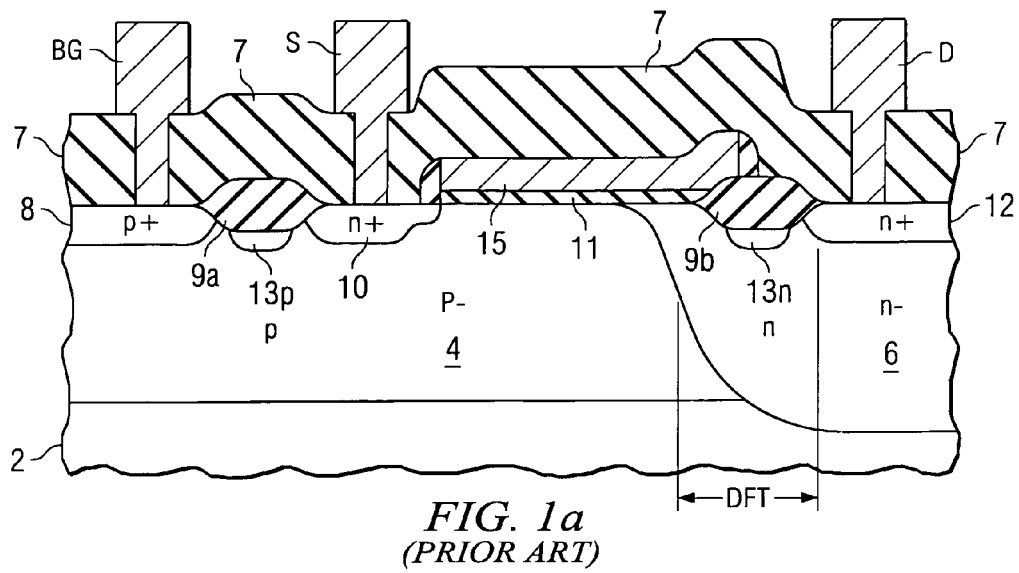
FIGS. 1a and 1b are cross-sectional and plan views, respectively, of a conventional drain-extended MOS transistor.
Figure 1B:
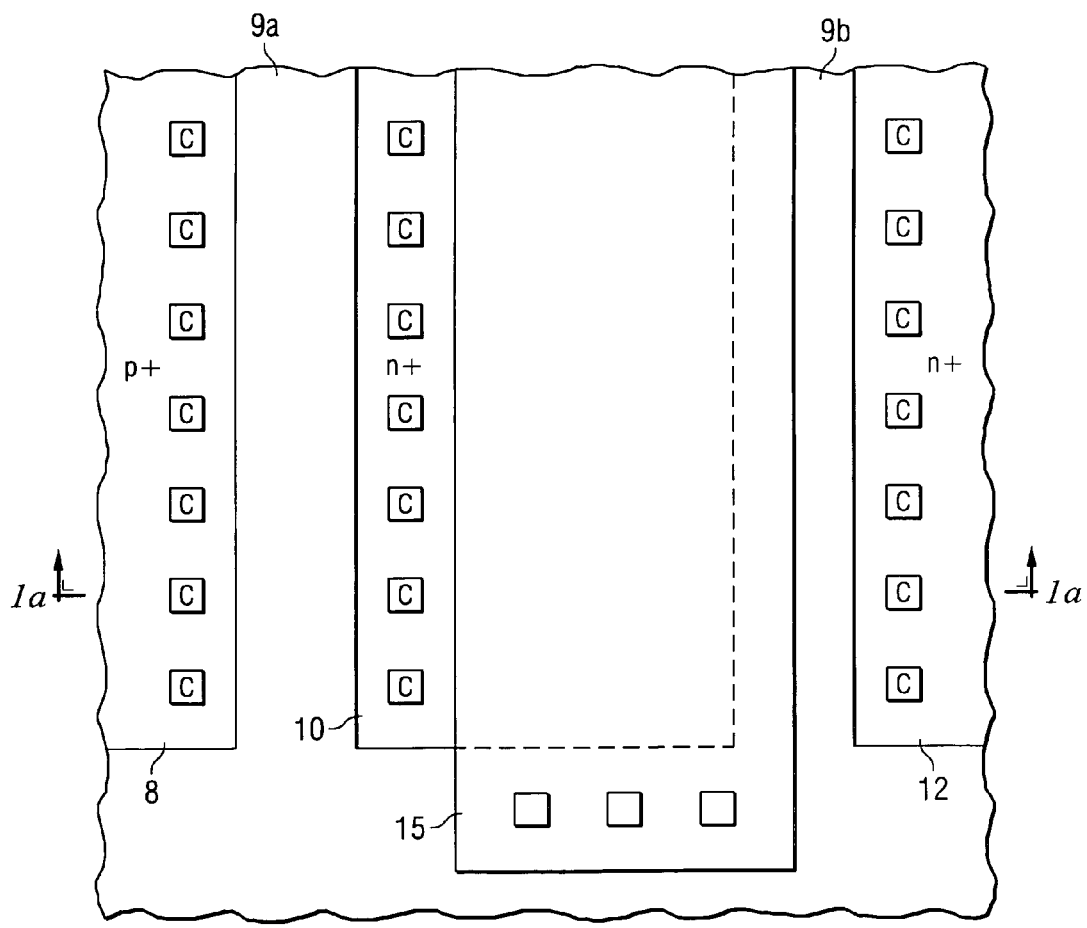
Figure 2:
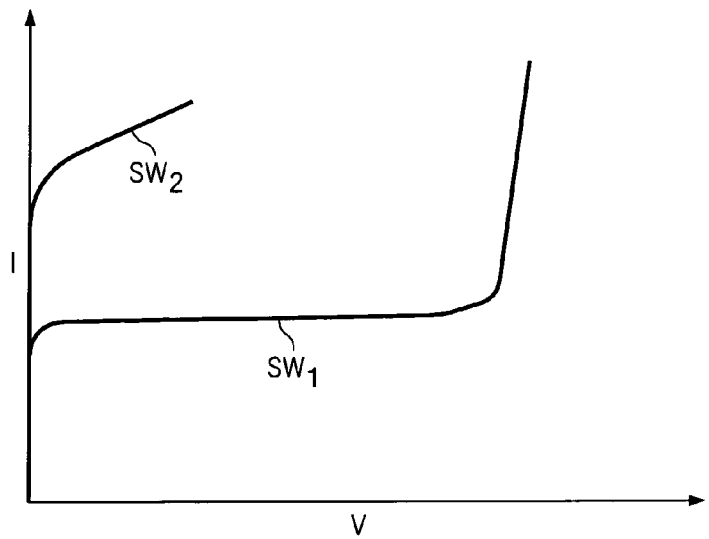
FIG. 2 is a plot of breakdown voltage characteristics for the conventional transistor of FIGS. 1a and 1b.

Transistor 40 according to this embodiment, in the cross-section illustrated in FIG. 3a, is therefore quite similar to the conventional transistor of FIGS. 1a and 1b and described above relative to the Background of the Invention. Transistor 40 is a drain-extended device, in that field oxide structure 29b is disposed at the drain end of the channel, and onto which gate electrode 35 overlaps. N-well 26 extends to or beyond field oxide structure 29b and has an edge underlying gate electrode 15. As such, drift region DFT within n-well 26 is in series with the channel of transistor 40 when in the on state. In this on state, electrons from source region travel through the inverted channel in p-well 24 underlying gate electrode to the portion of n-well 6 in drift region DFT. These electrons then drift through n-well 26 (and channel stop region 33n, perhaps) to the positively-biased drain region 32a.

According to the preferred embodiment of the invention, as shown in FIGS. 3b and 3c, the channel region of transistor 40 underlying gate electrode 35 is broken into electrically (and, in this case, physically) parallel sections by field oxide structures 29c disposed at selected points along the width of the channel between source region 30 and n-well 26. The number and spacing of field oxide structures 29c may vary, depending upon the chip area occupied by the device and the particular performance desired. At least one field oxide structure 29c is provided according to this embodiment of the invention, resulting in at least two parallel channel region sections; of course, several field oxide structures 29c will typically be utilized in most high power situations. FIG. 3b illustrates, in its plan view, that transistor 40 includes multiple source regions 30a, 30b, 30c to which contact is made by an overlying common metal conductor S (not shown in FIG. 3b). Similarly, multiple drain regions 32a, 32b, 32c are provided in a corresponding manner within n-well 26. Backgate contact region 28 can remain a unitary region, as shown in FIG. 3a.

Referring now to FIG. 3c, the cross-section of transistor 40 along a line underlying field oxide structure 29c will now be described. As shown in FIG. 3c, n-well 26 remains present underlying field oxide structure 29c, and gate electrode 35 extends over field oxide structure 29c as well. Channel stop regions 33p, 33n underlie field oxide structure 29c, in similar manner as they underlie field oxide structures 29a, 29b described above; as mentioned above, n-type channel stop region 33n need not be present within n-well 26 at transistor 40. P-type channel stop region 33p underlies the portion of field oxide structure 29c that overlies p-well 24, and n-type channel stop region 33n underlies the portion of field oxide structure that overlies n-well 26. As mentioned above, channel stop regions 33p, 33n are somewhat more heavily doped, for example by about two orders of magnitude, than their corresponding wells 24, 26. For example, p-well 24 and n-well 26 may each have a doping concentration in a range from about $1.0 \times 10^{15}$ cm$^3$ to about $5.0 \times 10^{17}$ cm$^3$ with corresponding p-type channel stop region 33p and n-type channel stop region 33n (if present) having a higher doping concentration than its corresponding well 24, 26, for example in a range from about $1.0 \times 10^{17}$ cm$^3$ to about $1.0 \times 10^{18}$ cm$^3$.

The definition of field oxide structures 29c according to the preferred embodiment of the invention is extremely simple to implement into the manufacturing process. For the example of LOCOS field oxide formation, the only change required is a change in the "inverse moat" photomask that is used to define openings in the patterned nitride layer at which the channel stop implant and field oxidation are to occur. Similarly, if shallow trench isolation is used, the implant and trench etch masks are modified. No additional photomask or photolithograpy operation, and no additional implant, is required.

Referring still to FIG. 3c, and as mentioned above, n-well 26 and gate electrode 35 are remain extending over the full width of transistor 40, and are not broken up by field oxide structures 29c as is the channel region of transistor 40. As a result, drift region DFT is still present under field oxide structure 29c, as shown in FIG. 3c. The presence of this unitary drift region DFT, along with channel stop regions 33p, 33n, and particularly p-type channel stop region 33p for this n-channel DEMOS transistor 40, will inhibit bipolar conduction during breakdown, as will be described in further detail below.

It has been observed, in connection with this invention, that the breakdown tolerance and robustness of transistor 40 according to the preferred embodiment of the invention is much improved over that of conventional drain-extended MOS devices, for example the conventional device described above relative to FIGS. 1a and 1b. The operation of transistor 40 according to the preferred embodiment of the invention, in both its normal "on" state and also its reverse breakdown state, will now be described relative to FIGS. 4a and 4b.

Figure 4A:
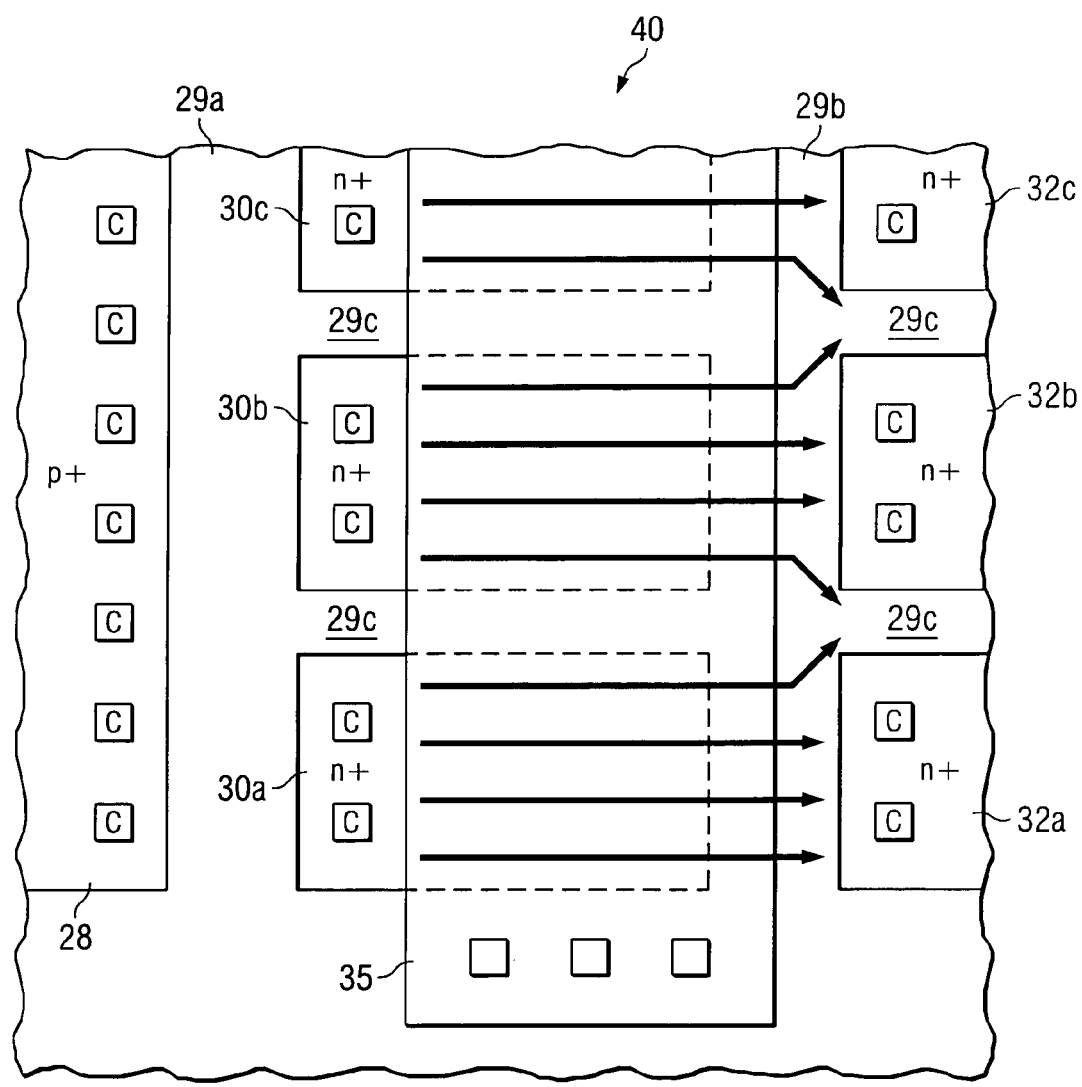
FIGS. 4a and 4b are schematic plan view diagrams illustrating conduction paths in "on" and reverse breakdown states for the transistor of FIGS. 3a through 3c according to the preferred embodiment of the invention.

In its normal "on" state, the conduction paths followed by electrons through the drift region DFT of transistor 40 is believed to correspond to the diagram of FIG. 4a. This "on" state, for this example of n-channel MOS transistor 40, corresponds to gate electrode 35 and drain regions 32a through 32c each biased to a voltage higher than that of source regions 30a through 30c. In this condition, electrons conduct from source regions 30a through 30c, through the channel region of p-well 24 underlying gate electrode 35, and into drift region DFT within n-well 26 and underlying field oxide structure 29b. The positive bias at drain regions 32a through 32c cause these carriers to drift to these drain regions 32a through 32c.

Of course, the series "on" resistance ($R_{ds\text{-}on}$) of transistor 40 is theoretically increased by the reduction in the effective channel width caused by field oxide structures 29c. It has been observed, according to this invention, that the increase in "on" resistance due to this construction is relatively minor, however. This is because the "on" resistance is typically dominated by the resistance of drift region DFT in drain-extended transistors such as transistor 40. Accordingly, the breaking up of the channel region according to this embodiment of the invention only slightly increases the overall "on" resistance. For example, an increase in $R_{ds\text{-}on}$ of about eight to ten percent has been observed in connection with this invention. Those skilled in the art will readily recognize that this relatively minor increased "on" resistance can be compensated by increasing the overall width of transistor 40 accordingly. The relatively minor increase in "on" resistance makes the impact on chip area to achieve this compensation quite small.

In addition, a slight increase (e.g., about 10–15 mV) in the threshold voltage has been observed to be present due to this construction, but this increase is believed to be well within the overall threshold voltage variation for transistors of this type (e.g., 150 mV), and is therefore considered to be insignificant.

Figure 4B:
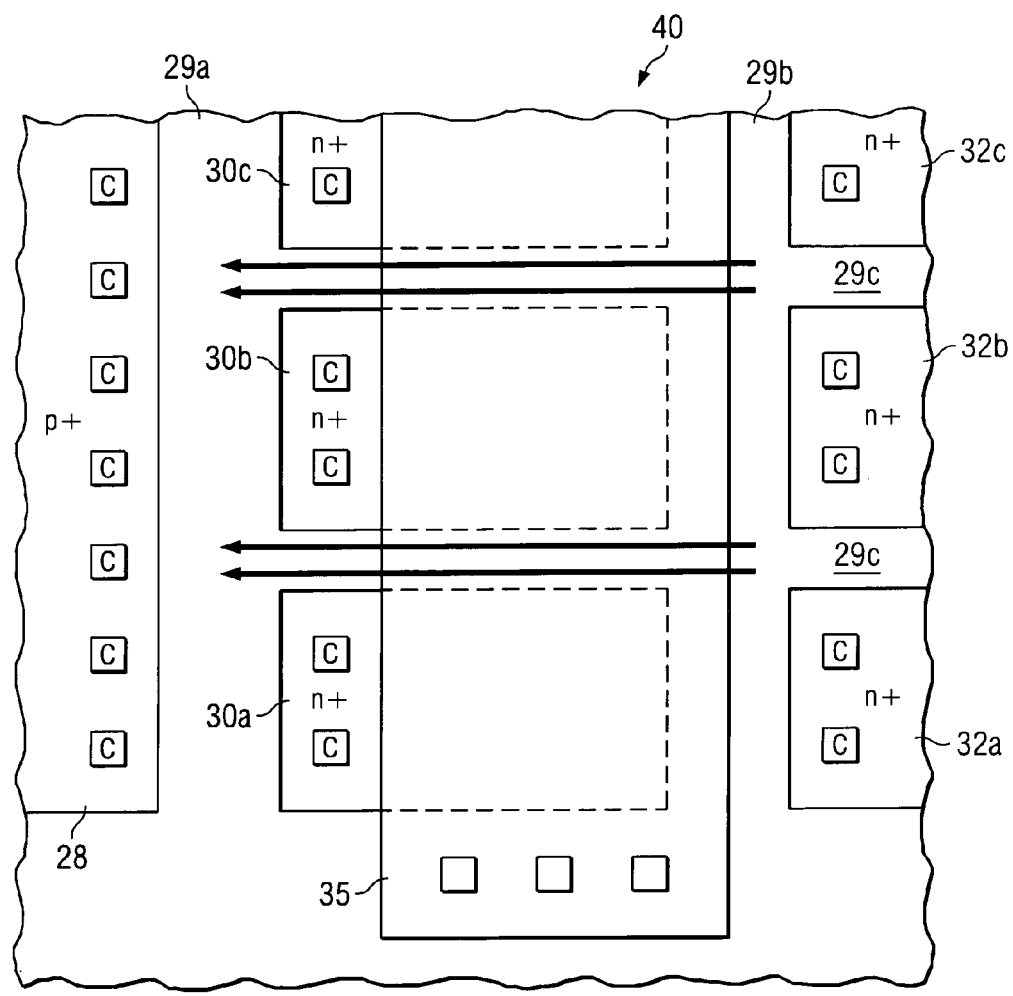

FIG. 4b schematically illustrates the conduction paths of carriers during the reverse breakdown of transistor 40. For this example of n-channel DEMOS transistor 40, reverse breakdown occurs at a very high voltage (on the order of 50 V) applied to drain regions 32a through 32c, with gate electrode 35, backgate contact region 28, and source regions 30a through 30c at ground. In this bias condition, breakdown typically occurs at the junction between n-well 26 and p-well 24, or inside n-well 26; this breakdown event generates both holes and electrons. Electrons generated at breakdown flow through n-well 26 to drain regions 32 and to drain conductor D. In breakdown, the generated holes preferentially conduct along p-type channel stop regions 33p that underlie field oxide structures 29c between the broken-up channel region segments. This preferential conduction for the holes in breakdown is because of the higher p-type dopant concentration in channel stop regions 33p relative to p-well 24.

It is believed that these conduction paths under field oxide structures 29c avoid bipolar conduction by way of the parasitic n-p-n transistor that is otherwise formed by drain regions 32 (collector), p-well 24 (base), and source regions 30 (emitter). By avoiding this bipolar conduction, it is believed that damage to transistor 40 during breakdown is avoided.

Figure 5:
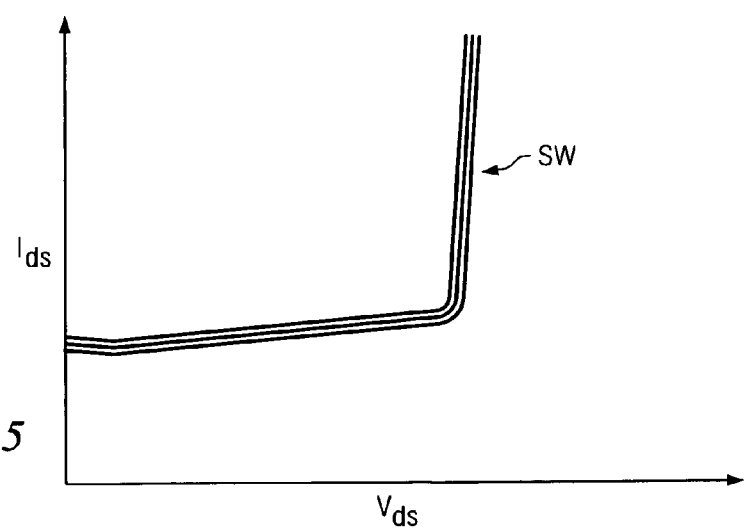
FIG. 5 is a plot of breakdown voltage characteristics for the transistor of FIGS. 3a through 3c according to the preferred embodiment of the invention.

FIG. 5 is a qualitative plot of measured current-voltage characteristics for an example of transistor 40 constructed according to the preferred embodiment of the invention, for a number of sweeps of voltage into reverse breakdown. It has been observed that the breakdown characteristic is repeatable for several repeated breakdown events for the same device, even with permitted breakdown currents as high as 100 $\mu$A for a transistor with total channel width of on the order of 20 $\mu$m. No damage due to the breakdown event is detectable, and the plot SW is substantially identical for each of the voltage sweeps.

In addition, it has been observed that the breakdown voltage of transistor 40 is not substantially impacted by the breaking up of the channel region, as shown in FIGS. 3b and 3c according to the preferred embodiment of the invention. It is believed that this effect is provided by gate electrode 35 remaining unitary, and overlapping field oxide structures 29c as well as the multiple channel regions of transistor 40. Accordingly, the breakdown performance is not adversely impacted by the preferred embodiment of the invention, and the breakdown tolerance and robustness is greatly improved.

Various alternative realizations will, of course, be apparent to those skilled in the art having reference to this specification. The number of sections of the channel region, and source and drain regions, may vary depending upon the implementation, upon the desired channel width, upon the geometries available, and depending upon tradeoffs between breakdown tolerance and device performance. In addition, it is contemplated that variations in the arrangement of the DEMOS device according to this invention may vary from that described herein; for example, the device may be arranged to conduct current in more than one direction, in a radial fashion, or in other arrangements as suitable for a particular implementation. In addition, the relationship of the doping concentrations of the elements of the device may also vary, depending not only on the performance of the DEMOS transistor itself, but also upon the requirements of other devices in the integrated circuit.

The DEMOS transistor according to this preferred embodiment of the invention thus provides important advantages. The DEMOS transistor can be constructed using the same doping concentrations for wells, channel stop, and source/drain regions as used in regular, non-drain-extended, devices in the integrated circuit. Conventional DEMOS transistors in which damage is caused by breakdown simply could not be fabricated in this manner, as the vulnerability to breakdown damage is not acceptable in modern integrated circuits. This necessitated additional photolithography and ion implantation steps for the formation of DEMOS devices in these conventional arrangements. These additional steps are not necessary according to this invention, as the DEMOS device having tolerance and robustness even for strong breakdown events can be fabricated using the same processes as the non-drain-extended devices. The breakdown voltage performance and "on" resistance of the DEMOS device according to this preferred embodiment of the invention is also not significantly impacted. It is therefore contemplated that the DEMOS transistor according to this invention will provide freedom to the circuit designer in optimizing the process conditions for best performance of the regular transistors, without being limited by the breakdown vulnerability of the DEMOS device.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A drain-extended transistor, formed at a semiconductor surface of a body, comprising:
   a first source region of first conductivity type, and disposed at a region of the surface having a second conductivity type;
   an insulating structure disposed at the surface near the first source region, and disposed over a portion of a lightly-doped region of the first conductivity type to define a drift region thereunder;
   at least one drain region of the first conductivity type disposed in the lightly-doped region and spaced from the first source region by a first isolation structure;
   a plurality of channel regions of the second conductivity type disposed adjacent the first source region in the region of the surface having the second conductivity type, and disposed between the first source region and the at least one drain region;
   at least one isolation structure disposed between adjacent ones of the plurality of channel regions;
   at least one doped region of the second conductivity type, each underlying a corresponding isolation structure; and
   a gate electrode disposed over the plurality of channel regions, over the at least one isolation structure, and over at least a portion of the drift region.

2. The transistor of claim 1, further comprising:
   an insulator layer disposed over the first source region, the gate electrode, and the at least one drain region; and
   a plurality of metal conductors, each in contact with a corresponding one of the first source region, gate electrode and the at least one drain region through contact openings in the insulator layer.

3. The transistor of claim 2, further comprising:
a backgate contact region, of the second conductivity type, disposed at the region of the surface having the second conductivity type near the source region; and
a metal conductor in contact with the backgate contact region through a contact opening in the insulator layer.

4. The transistor of claim 1, further comprising:
a backgate contact region, of the second conductivity type, disposed at the region of the surface having the second conductivity type near the source region.

5. The transistor of claim 1, wherein the at least one drain region comprises a plurality of drain regions, each associated with a corresponding one of the plurality of channel regions.

6. The transistor of claim 5, wherein the insulating structure is disposed between each of the plurality of drain regions and the corresponding ones of the plurality of channel regions.

7. The transistor of claim 6, further comprising:
a doped region of the first conductivity type underlying the insulating structure.

8. The transistor of claim 1, wherein the at least one doped region of the second conductivity type has a dopant concentration at least about one order of magnitude higher than that of the region of the surface having a second conductivity type.

9. The transistor of claim 1, wherein the lightly-doped region comprises a well region extending beyond the insulating region toward the source region, so that the at least one isolation structure overlaps the well region;
and further comprising:
at least one doped region of the first conductivity type, each underlying a portion of a corresponding isolation structure in the well region.

10. The transistor of claim 9, wherein the at least one doped region of the first conductivity type has a dopant concentration at least about one order of magnitude higher than that of the well region.

11. The transistor of claim 1, wherein the at least one doped region of the second conductivity type has a dopant concentration at least about one order of magnitude higher than that of the region of the surface having a second conductivity type.

12. The transistor of claim 11, wherein the region of the surface having a second conductivity type comprises a well of the second conductivity type disposed at a region of the surface.

13. The transistor of claim 1, wherein the region of the surface having a second conductivity type comprises a well of the second conductivity type disposed at a region of the surface.

14. The transistor of claim 1, wherein the first conductivity type is n-type and the second conductivity type is p-type.

15. The transistor of claim 1, wherein the insulating structure and the at least one isolation structure are contiguous with one another.

16. The transistor of claim 15, wherein the insulating structure and the at least one isolation structure each comprise field oxide.

17. The transistor of claim 15, wherein the insulating structure and the at least one isolation structure are each comprise a deposited insulator structure disposed within a trench in the surface.

* * * * *